United States Patent
Saito et al.

(10) Patent No.: US 7,171,180 B2
(45) Date of Patent: Jan. 30, 2007

(54) AM RECEIVER CIRCUIT PERFORMING SOUND QUALITY COMPENSATION OF AM DETECTION OUTPUT SIGNAL

(75) Inventors: Yasuji Saito, Gunma-ken (JP); Yutaka Hirakoso, Koga (JP); Masaaki Taira, Akashi (JP)

(73) Assignee: Sanyo Electric Co., Ltd., Osaka (JP)

( * ) Notice: Subject to any disclaimer, the term of this patent is extended or adjusted under 35 U.S.C. 154(b) by 339 days.

(21) Appl. No.: 10/929,622

(22) Filed: Aug. 30, 2004

(65) Prior Publication Data

US 2005/0059374 A1 Mar. 17, 2005

(30) Foreign Application Priority Data

Aug. 29, 2003 (JP) ............... 2003-307426

(51) Int. Cl.
*H04B 17/00* (2006.01)
*H04B 1/10* (2006.01)

(52) U.S. Cl. ............... 455/226.4; 455/234.1; 455/312

(58) Field of Classification Search ........... 455/230, 455/232.1, 234.1, 234.2, 296, 307, 312, 313, 455/323, 226.1, 226.2, 250.1, 226.4
See application file for complete search history.

(56) References Cited

U.S. PATENT DOCUMENTS 5,784,466 A * 7/1998 Whitecar et al. ............ 381/15

FOREIGN PATENT DOCUMENTS

| JP | 7-22975 | 1/1995 |
|---|---|---|
| JP | 2000-13340 | 1/2000 |

OTHER PUBLICATIONS

English Patent Abstract for 7-22975 from esp@cenet, published Jan. 24, 1995.
English Patent Abstract for 2000-13340 from esp@cenet, published Jan. 14, 2000.

* cited by examiner

*Primary Examiner*—Nguyen T. Vo
(74) *Attorney, Agent, or Firm*—Osha Liang LLP (57) ABSTRACT

An AM receiver circuit comprises an IF intensity detection section which detects intensity of a carrier wave of an IF signal and outputs an IF signal carrier wave intensity signal in accordance with the detected intensity. The IF intensity detection section extracts the carrier wave frequency component of the IF signal using a BPF, and converts the extracted intensity of the IF signal carrier wave intensity into a direct current signal using an integrator, to thereby obtain the IF signal carrier wave intensity signal. A sound compensation section, which serves to compensate sound quality of an audio signal output from an AM detection section, performs sound quality compensation based on the IF signal carrier wave intensity signal when the received field intensity is low. In this manner, appropriate sound quality compensation can be performed even when the received broadcast wave field intensity is low.

3 Claims, 5 Drawing Sheets

AM RECEIVER CIRCUIT PERFORMING SOUND QUALITY COMPENSATION OF AM DETECTION OUTPUT SIGNAL

CROSS-REFERENCE TO RELATED APPLICATIONS

The priority Japanese application No. 2003-307426 upon which this patent application is based is hereby incorporated by reference.

BACKGROUND OF THE INVENTION

1. Field of the Invention

The present invention relates to an AM receiver circuit, and more particularly to an AM receiver circuit which performs sound quality compensation in accordance with field intensity of a received broadcast wave when the field intensity is low.

2. Description of the Related Art

According to the amplitude modulation (AM) method, a signal to be transmitted (modulation signal) is transmitted on the amplitude of a carrier wave having a frequency that can be broadcast from a broadcast station. The AM method is mainly employed for medium frequency radio broadcast (526.5 to 1606.5 kHz). A radio wave within the medium-length broadcast frequency band is characterized in that it propagates not only as a ground wave, but also as a space wave, especially during nighttime, which is reflected by the ionosphere (E layer) located approximately 100 km from the ground. Accordingly, use of a medium-length radio wave makes it possible to serve a large service area. Further it is also possible to provide a stable service to moving bodies such as vehicles.

A receiver for receiving an AM signal typically employs the super-heterodyne detection method. According to the super-heterodyne detection method, a signal from a broadcast station is synthesized with a signal generated by an oscillator (local oscillator) circuit included within the receiver so as to be converted into an intermediate frequency wave, and the converted signal is subsequently amplified and demodulated. This method is advantageous in that high amplification gain can be easily obtained and crosstalk can be minimized. In order to select a desired broadcast wave, a band-pass filter that permits passage of the frequency of that particular broadcast wave alone is required. Because it is very difficult to continuously change the center frequency of a band-pass filter without changing the band characteristic of the filter, the local oscillation frequency is typically altered to convert received signals into intermediate frequency waves having a predetermined frequency, such that waves having only the predetermined frequency need be passed.

In an output obtained at a speaker of an AM receiver, the amount of noise generated by an amplifier or the like increases in relation to the signal as the field intensity of the broadcast wave input into the antenna becomes lower.

In order to maintain an output audio signal at a constant level even when the field intensity of the broadcast wave input into the antenna fluctuates, a receiver for receiving an AM signal is generally provided with an AGC (automatic gain control) circuit for adjusting the amplification factor of an RF signal amplifier or intermediate frequency amplifier.

A technique of changing, in accordance with the field intensity of a received broadcast wave, the sensitivity of an AGC circuit for amplifying a received RF signal is known, as disclosed in Japanese Patent Laid-Open Publication No. Hei 7-22975, for example.

Further, in order to minimize auditory unpleasantness caused by a decrease in the signal-to-noise (s/n) ratio during input of a low field intensity signal, a sound quality compensation circuit for compensating sound quality is often provided in an audio signal circuit disposed in a stage subsequent to a detecting section.

For example, in an FM receiver, a technique of controlling a tone control circuit in accordance with the field intensity of a received broadcast wave so as to adjust the sound quality of an output signal is known, as disclosed in Japanese Patent Laid-Open Publication No. 2000-13340.

In a receiver for receiving an AM signal, an AGC control voltage (hereinafter referred to as the signal strength (S) meter signal output) of an AGC circuit is conventionally employed as information regarding the field intensity of a received broadcast wave signal.

Figure 1:
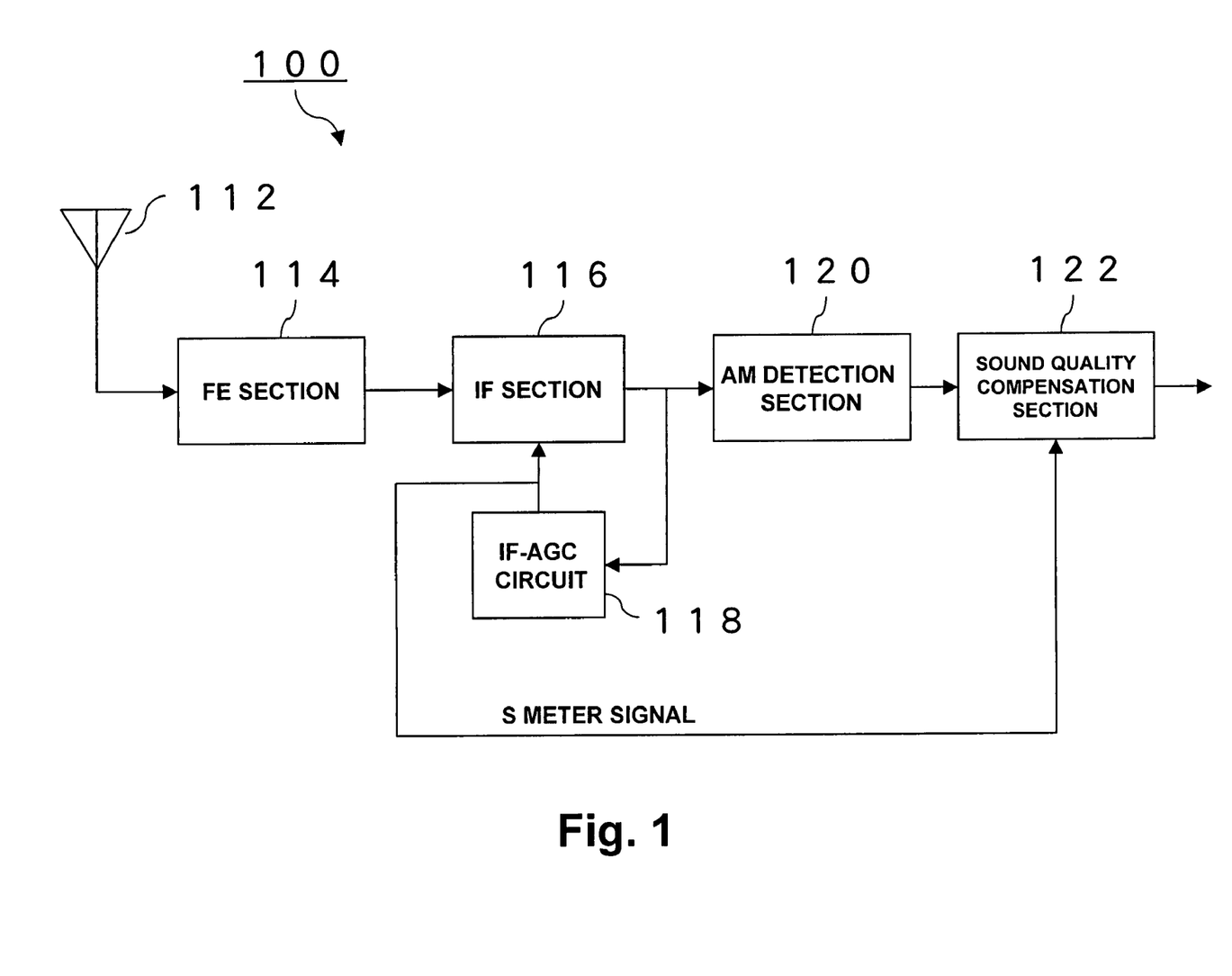
FIG. 1 is a schematic diagram showing a configuration of a prior art AM receiver circuit.

A conventional sound quality compensation method used in an AM receiver circuit is described as follows. FIG. 1 is a schematic diagram showing a configuration of an example conventional AM receiver circuit 100. Broadcast wave signals received by an antenna 112 are input into a front end (FE) section 114. The FE section 114 includes an RF amplifier and a tuning circuit, and serves to amplify and selectively tune to a broadcast wave signal for supplying an output. An intermediate frequency (IF) signal section 116 serves to convert the frequency of a carrier wave. The IF signal section 116 comprises a local oscillator for outputting a signal having a frequency that differs by a predetermined level (typically 450 kH) from that of a received broadcast wave, and a mixer for mixing the broadcast wave signal and the local oscillator signal. Using those components, the IF signal section 116 converts the carrier wave frequency of a desired broadcast wave selected from among the received broadcast waves into a predetermined intermediate frequency (typically 450 kH). Further, using a band-pass filter (BPF) having the center frequency corresponding to the intermediate frequency, the desired signal alone is extracted and amplified for output as the intermediate frequency (IF) signal. The AM receiver circuit 100 further comprises an IF-AGC circuit 118 for maintaining constant intensity of the IF signal output from the IF signal section 116. The IF-AGC circuit 118 receives a portion of the output from the IF signal section 116, generates an AGC control voltage (signal strength meter signal), and supplies the voltage as feedback to the IF signal section 116. In this manner, the IF-AGC circuit 118 controls the gain of the amplifier of the IF signal section 116.

The signal output from the IF signal section 116 is input into an AM detection section 120. The AM detection section 120 removes the carrier wave component from the IF signal to obtain an audio signal, which is the original modulation signal. A sound quality compensation section 122 employs the S meter signal (signal strength meter signal) generated by the IF-AGC circuit 118 as a signal reflecting information regarding the received broadcast field intensity, and performs sound quality compensation in accordance with the S meter signal.

Figure 2:
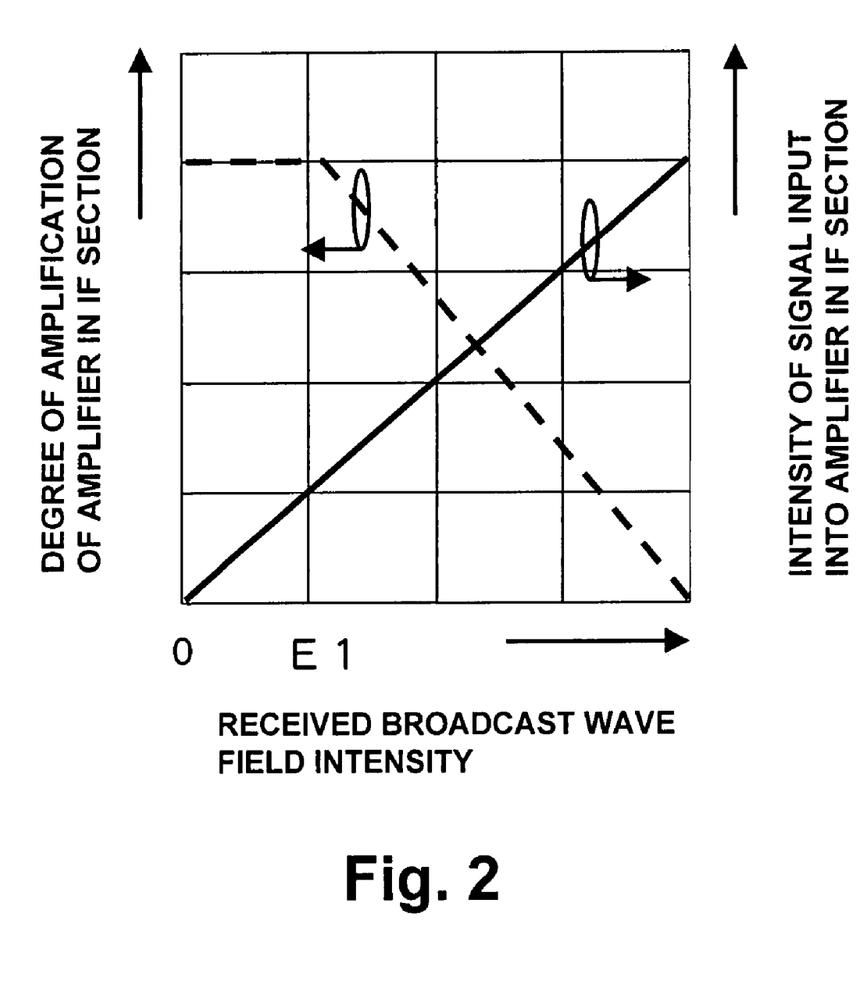
FIG. 2 is a graph showing a relationship between the intensity (denoted by a solid line) of a signal input into an amplifier of an IF signal section and the degree of amplification (denoted by a dashed line) performed by the amplifier, given as functions of the received field intensity.

FIG. 2 is a graph showing a relationship between the intensity (denoted by a solid line) of a signal input into the amplifier of the IF signal section 116 and the degree of amplification (denoted by a dashed line) performed by the amplifier, given as functions of the field intensity received at the antenna 112. Generally speaking, when the received field intensity becomes higher, the intensity of signal input into the amplifier increases while the degree of amplification is reduced by the function of the AGC circuit 118. However, because there is a maximum limit to the degree of amplification that can be performed by the amplifier of the IF signal section 116 (amplification factor of the circuit), the degree of amplification remains at a constant level regardless of the received field intensity when the received field intensity is below E1.

Figure 3:
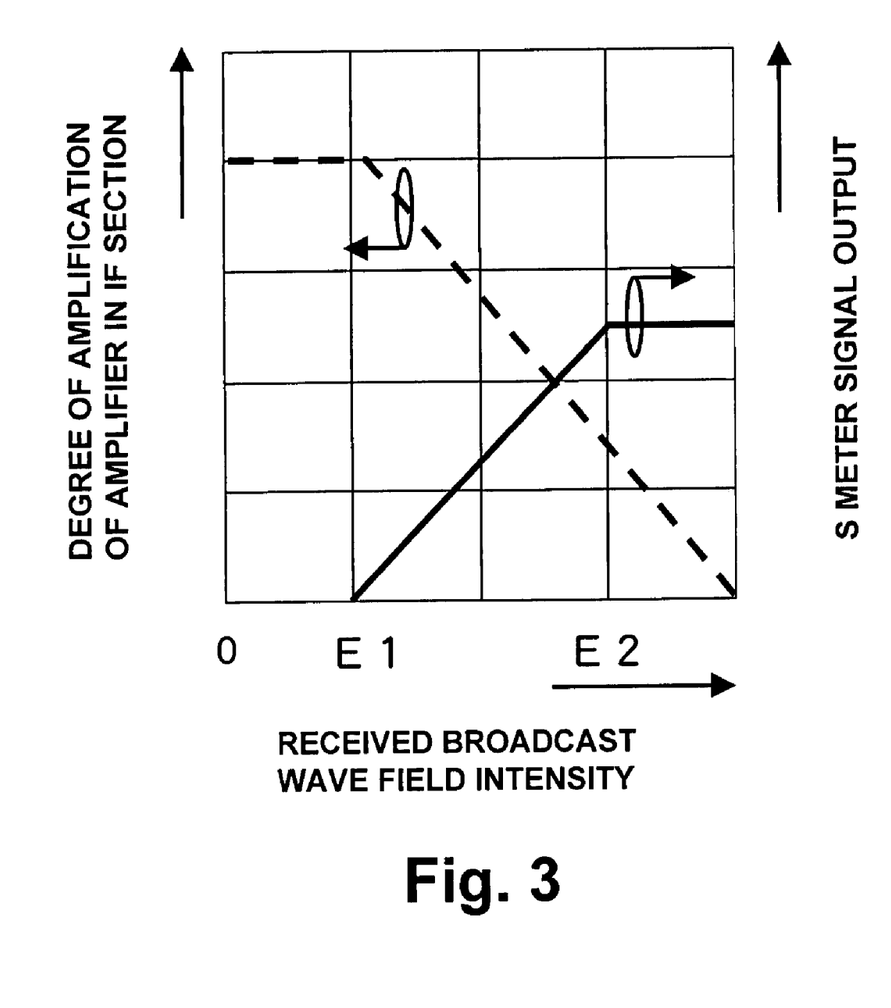
FIG. 3 is a graph showing a relationship between the degree of amplification (denoted by a dashed line) performed by the amplifier of the IF signal section and the S meter signal output (denoted by a solid line), given as functions of the received field intensity.

FIG. 3 illustrates a relationship between the degree of amplification (denoted by a dashed line) performed by the amplifier of the IF signal section 116 and the S meter signal output (denoted by a solid line), given as functions of the field intensity received at the antenna 112. When the received field intensity is at the level of E1 or higher, the AGC circuit 118 outputs the S meter signal in accordance with the field intensity of the received broadcast wave signal, and the degree of amplification by the amplifier is controlled by the AGC circuit 118 so as to supply an output signal having a constant intensity. However, when the received field intensity is below E1, the S meter signal denoting the detection level is not output because the S meter signal sensitivity is low. Accordingly, at a received field intensity below E1, the AGC circuit 118 fails to function, resulting in a constant degree of amplification by the amplifier of the IF section.

As described above, in a conventional method using the S meter signal output as the information denoting the field intensity of the received broadcast wave, sound quality compensation can be performed in accordance with the field intensity only when the field intensity is greater than E1. When the field intensity of the received broadcast wave is below E1 (under a low field intensity environment), no field intensity information can be obtained, resulting in a failure to perform appropriate sound quality compensation.

SUMMARY OF THE INVENTION

An advantage of the present invention is that, in an AM receiver circuit which performs sound quality compensation, field intensity of a received broadcast wave can be determined even when the field intensity is low, such that appropriate sound quality compensation can be performed in accordance with low field intensity levels.

The present invention provides an AM receiver circuit which performs sound quality compensation of an AM detection output signal. The AM receiver circuit comprises an intermediate frequency signal section which amplifies and outputs an intermediate frequency signal generated from a received broadcast wave, an AM detection section which detects and outputs an AM modulation signal from the intermediate frequency signal output, a band-pass filter for extracting a carrier wave frequency component from the intermediate frequency signal output, an integrator for integrating the output from the band-pass filter so as to convert the carrier wave intensity of the intermediate frequency signal output into a direct current voltage for output, and a sound quality compensation section which compensates sound quality of an output signal from the AM detection section in accordance with the direct current voltage output from the integrator. With this arrangement, field intensity of the received broadcast wave can be determined even when the field intensity is low, such that appropriate sound quality compensation can be performed in accordance with low field intensity levels.

DESCRIPTION OF THE PREFERRED EMBODIMENTS

Preferred embodiments of the present invention will next be described referring to the drawings.

Figure 4:
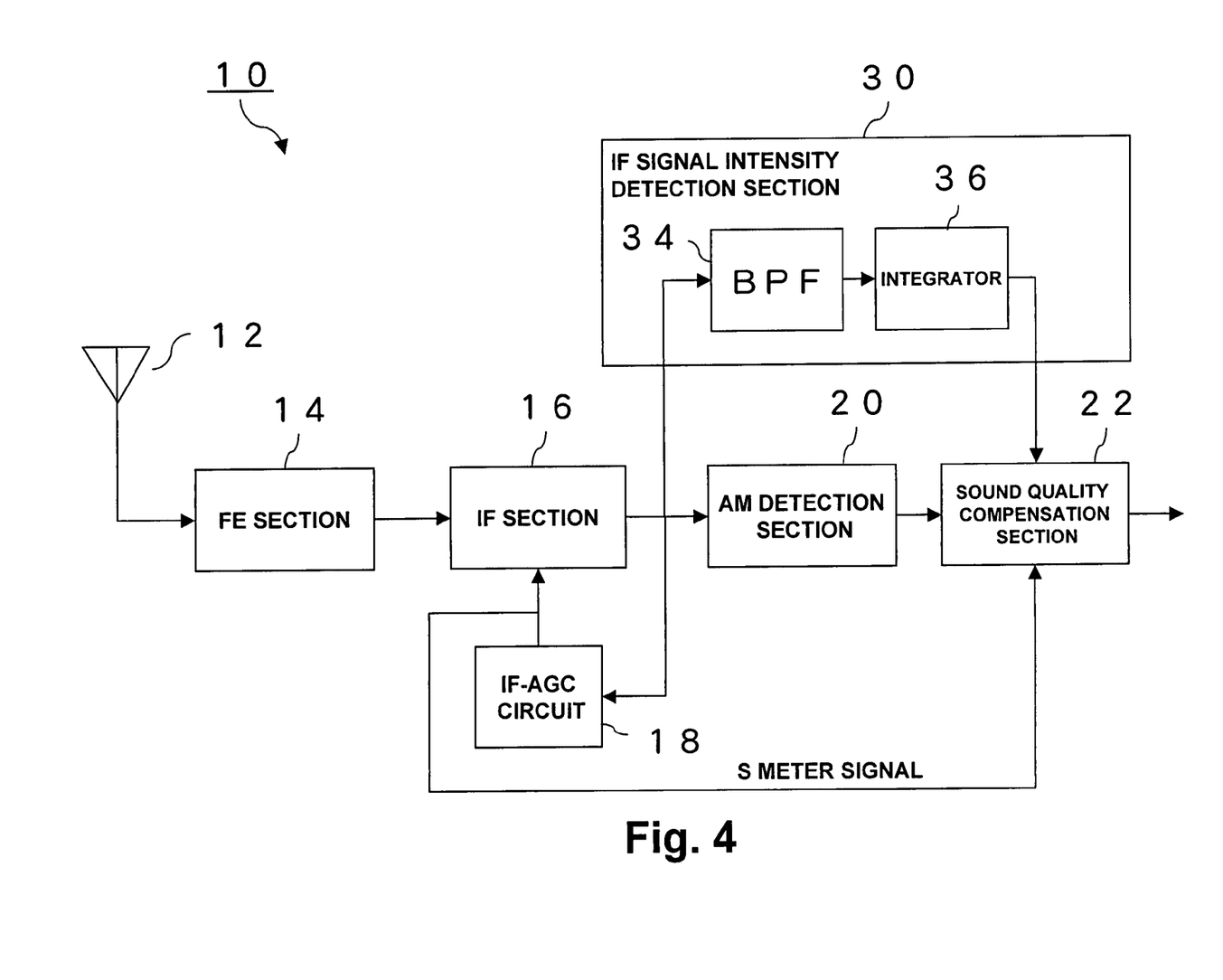
FIG. 4 is a diagram showing a configuration of an AM receiver circuit according to a first embodiment of the present invention.

FIG. 4 is a diagram showing a configuration of an AM receiver circuit 10 according to a first embodiment of the present invention.

In FIG. 4, broadcast waves are received by an antenna 12, and the broadcast wave signals are input into a front end (FE) section 14. The FE section 14 selectively tunes to and outputs a broadcast wave (RF) signal. This FE section 14 includes an RF amplifier for amplifying the RF signal.

An intermediate frequency (IF) signal section 16 serves to convert the frequency of a carrier wave. The IF signal section 16 comprises a local oscillator for outputting a signal having a frequency that differs by a predetermined level (typically 450 kH) from that of the desired broadcast wave, and a mixer for mixing the broadcast wave signal and the local oscillator signal. Using those components, the IF signal section 16 converts the carrier wave frequency of the desired broadcast wave selected from among the received broadcast waves into a predetermined intermediate frequency (typically 450 kH). Further, using a band-pass filter (BPF) having the center frequency corresponding to the intermediate frequency, the intermediate frequency is extracted as the IF signal. This IF signal is an amplitude modulation signal having the same information as the broadcast wave. The IF signal is then amplified and output by an amplifier. In the present embodiment, the IF section 16 is configured with a single-stage structure, in which the IF signal having the carrier wave of 450 KHz is produced directly. Alternatively, the IF section 16 may be configured with a two-stage structure including a first IF stage for initially up-converting the carrier wave frequency to 10.7 MHz and a second IF stage for subsequently down-converting the obtained first IF signal to 450 KHz. It should be noted that the frequency of 10.7 MHz is commonly used as the frequency of an IF signal in an FM receiving circuit. According to this alternative embodiment, a receiver for receiving both AM broadcast waves and FM broadcast waves can be configured to use the circuitry subsequent to the IF section in common for AM and FM reception.

The intensity of a signal input into the IF section 16 is proportional to the intensity of a broadcast wave signal input into the antenna 12, that is, the broadcast wave field intensity. Accordingly, when the field intensity varies depending on receiving locations and received stations, the level of signal output from the IF section 16 would also be varied, resulting in undesirable fluctuations in the level of output audio signal. To overcome this problem, an automatic gain control (IF-AGC) circuit 18 for maintaining a constant level of signal output from the IF section 16 is provided. The IF-AGC circuit 18 extracts a portion of the intermediate frequency signal output, and, using a diode, generates a direct current voltage (AGC voltage or S meter signal) proportional to the extracted amplitude. Based on the generated S meter signal, the IF-AGC circuit 18 controls the gain of the amplifier of the IF signal section 16. In other words, the IF-AGC circuit 18 increases the gain of the amplifier of the IF signal section 16 when the received field intensity is low, and reduces the gain when the received field intensity is high, such that fluctuations in the received field intensity are prevented from being reflected in the audio output.

When employing an IF section having a two-stage structure, the S meter signal may be produced using an output from the first IF stage or the second IF stage. Further, when employing a receiver circuit configured as a digital signal processor (DSP) which digitizes and demodulates the IF signal, the S meter signal may be produced by performing calculations using the digital IF signal.

The signal output from the IF section 16 is input into an AM detection section 20. The AM detection section 20 removes the carrier wave component to obtain an audio signal, which is the original modulation signal.

The audio signal output from the AM detection section 20 is input into a sound quality compensation section 22. The sound quality compensation section 22 compensates sound quality by changing a frequency characteristic of the audio signal. This sound quality compensation is preferably performed in accordance with the received broadcast wave field intensity. For example, when the received broadcast wave field intensity is sufficiently high, no sound compensation is necessary. However, at a low received field intensity, the amplification factor of the amplifier circuit in the IF section 16 is increased by the IF-AGC circuit 18, and this results in a larger proportion of noise with respect to the audio signal because noise present over a broad bandwidth is amplified by the amplifier circuit. In such a case, sound quality compensation for attenuating bandwidths other than around the center frequency of the audio signal may be performed to reduce the proportion of noise with respect to the audio signal, thereby minimizing auditory unpleasantness. Alternatively, the output level of the audio signal may be increased to enhance audibility of the audio signal. Further, the noise reduction and the increase of the audio signal output level may be performed in combination. Compensation in these ways may be switched on and off in accordance with the received broadcast wave field intensity, or, alternatively, the degree of compensation may be changed relative to the field intensity. The sound quality compensation section 22 may be configured as an analog circuit or as a DSP for processing a digital signal.

The output from the sound quality compensation section 22 is transmitted to an amplifier circuit to be amplified and then output from a speaker or the like.

The characteristic features of the present invention are that the received broadcast wave field intensity is determined based on the carrier wave intensity of the IF signal, and the sound quality compensation section 22 performs sound quality compensation in accordance with the IF signal carrier wave intensity. An IF signal carrier wave intensity signal, which denotes the IF signal carrier wave intensity, is obtained by extracting, using a BPF 34, the carrier wave frequency component of the IF signal output from the IF section 16, and converting the extracted carrier wave of the IF signal into a direct voltage signal using an integrator 36. According to this method, because intensity of the carrier wave frequency component of the IF signal is detected, information reflecting the received field intensity can be obtained even when the received field intensity is low. By configuring the BPF 34 to specifically select only the carrier wave frequency component, the influence of noise in other frequencies can be eliminated. Because the carrier wave frequency component alone need be passed, it is preferable to use, in the IF signal intensity detection section 30, a BPF having a pass-band narrower than that of a ceramic filter used for filtering the audio signal from the IF signal. In an arrangement in which the IF signal is digitized, digital BPF processing for obtaining a narrow band is preferably performed.

Figure 5:
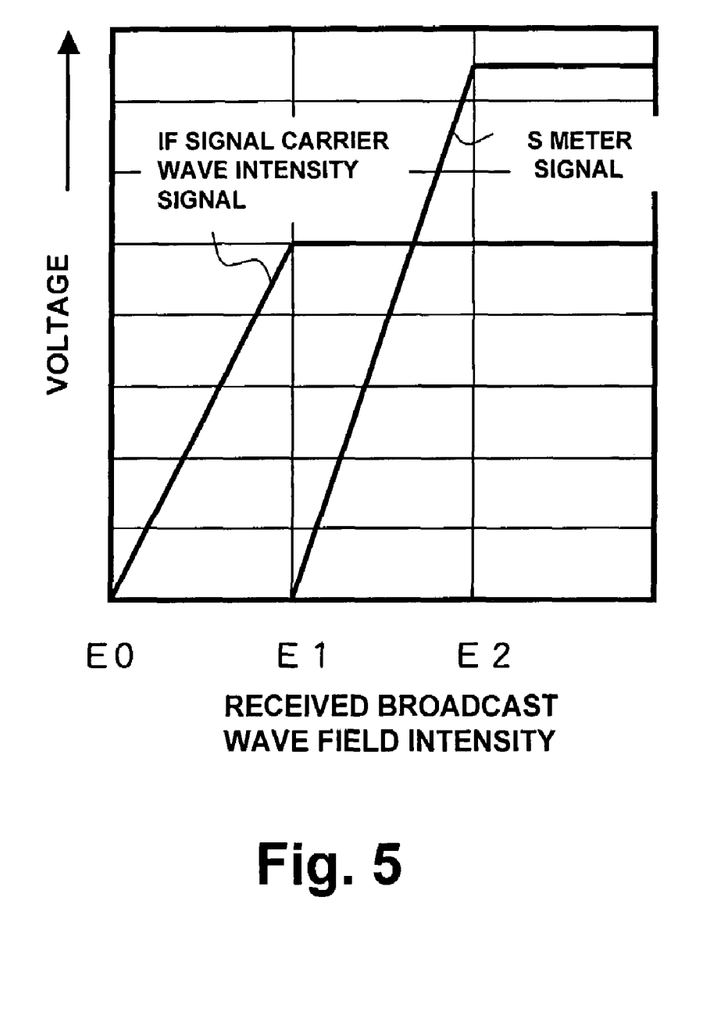
FIG. 5 is a graph showing the voltage of a signal denoting IF signal carrier wave intensity and the voltage of the S meter signal, given as functions of the received field intensity.

FIG. 5 shows the voltage of the IF signal carrier wave intensity signal and the voltage of the S meter signal, given as functions of the received broadcast wave field intensity. As can be seen, when the received field intensity is below E1, the S meter signal is not output because the AGC circuit fails to function due to the limitation of the amplification factor of the amplifier. In contrast, the IF signal carrier wave intensity signal is output at a voltage in accordance with the received field intensity even when the received field intensity is below E1.

Accordingly, when the received field intensity is below E1, the IF signal carrier wave intensity is used as information reflecting the received broadcast field intensity. The level E1 of the field intensity, at and above which the S meter signal is output, is dependent on factors such as the circuit structure of the FE section and the IF section of the receiver circuit, but is generally approximately 20 dBµV.

According to the present embodiment, under a low field intensity condition (below approximately 20 dBµV) where no S meter signal is output, accurate information regarding the received broadcast wave field intensity can be obtained based on the IF signal carrier wave intensity. Using the obtained information, sound quality compensation can be optimally performed in accordance with the received broadcast wave field intensity.

The above-described configuration for obtaining information regarding the received broadcast wave field intensity is particularly more useful in an AM receiver circuit compared to in an FM receiver circuit. In an FM receiver circuit, the carrier wave intensity obtained at the IF signal frequency of 450 kHz is substantially uniform regardless of the received field intensity. In contrast, in an AM receiver circuit, a low level of received broadcast wave field intensity is reflected in the IF signal wave.

It should be noted that, when the received broadcast wave field intensity is at or above E1 in FIG. 5, the sound quality compensation section 22 preferably compensates sound quality based on the S meter signal. When the received field intensity exceeds E1, the carrier wave intensity of the IF signal output from the IF section 16 becomes uniform due to the function of the IF-AGC circuit 18, such that the intensity of the carrier wave frequency component of the IF signal would not serve as information regarding the received broadcast wave field intensity. At a received broadcast wave field intensity equivalent to or above E1, the S meter signal serves as the information reflecting the received field intensity, based on which the sound quality compensation section 22 is operated. In this manner, appropriate sound quality compensation in accordance with the received field intensity can be achieved.

The operation of the sound quality compensation section 22 using the IF signal carrier wave intensity signal when the received broadcast wave field intensity is low and using the S meter signal when the received field intensity is high can be accomplished by adding those two signals. As shown in FIG. 5, the S meter signal is not output at a low received broadcast wave field intensity (below E1). Further, when the received field intensity is high (above E1), the IF signal carrier wave intensity signal is maintained at a constant level. Accordingly, by adding those signals, an added signal which accurately reflects the received field intensity at any intensity level can be obtained. When this added signal is to be used by the sound quality compensation section 22 to perform sound quality compensation, the integrator 36 which outputs the IF signal carrier wave intensity signal and the IF-AGC circuit 18 which outputs the S meter signal are configured such that the IF signal carrier wave intensity signal and the S meter signal have substantially identical signal voltage slopes with respect to the received broadcast wave field intensity. The added signal is a voltage signal proportional to the received broadcast wave field intensity in ranges both below and above E1. By operating in accordance with the voltage of the added signal, the sound quality compensation section 22 can perform sound quality compensation relative to the received field intensity. Alternatively, the above-described signal addition may not be employed, and instead, the sound quality compensation section 22 may be configured to switch between the IF signal carrier wave intensity signal and the S meter signal at a point when the IF signal carrier wave intensity signal or the S meter signal reaches a predetermined voltage level.

In the AM receiver circuit 10 shown in FIG. 4, an RF-AGC circuit may be additionally provided for controlling the amplification factor of the RF amplifier disposed within the FE section 14 in accordance with the output signal intensity of the FE section 14. When using this arrangement, the RF-AGC circuit outputs an RF-AGC control voltage (RF-S meter signal). The RF-AGC control voltage may be used in place of the above-described S meter signal output from the IF-AGC circuit 18. Alternatively, the RF-AGC control voltage and the S meter signal from the IF-AGC circuit 18 may be employed selectively, added together, combined, or used in any other appropriate ways to obtain a signal denoting received signal strength.

As described above, the carrier wave frequency component is extracted from the intermediate frequency signal output using a band-pass filter, and the output from the band-pass filter is integrated so as to convert the intensity of the carrier wave frequency component of the intermediate frequency signal into a direct current voltage. In accordance with this direct current voltage, sound quality is compensated. In this manner, even when the received broadcast wave field intensity is low, the field intensity can be accurately determined, thereby enabling appropriate sound quality compensation for minimizing auditory unpleasantness.

What is claimed is:

1. An AM receiver circuit which performs sound quality compensation of an AM detection output signal, comprising:
   an intermediate frequency signal section which amplifies and outputs an intermediate frequency signal generated from a received broadcast wave;
   an AM detection section which detects and outputs an AM modulation signal from the intermediate frequency signal output;
   a band-pass filter for extracting a carrier wave frequency component from the intermediate frequency signal output;
   an integrator for integrating an output from the band-pass filter and outputting a direct current voltage denoting intensity of the carrier wave of the intermediate frequency signal; and
   a sound quality compensation section which compensates sound quality of the signal output from the AM detection section in accordance with the direct current voltage output from the integrator.

2. An AM receiver circuit which performs sound quality compensation of an AM detection output signal, comprising:
   a front end section which amplifies a received broadcast wave signal input from an antenna, and outputs a received broadcast wave signal output;
   an intermediate frequency signal section which generates an intermediate frequency signal from the received broadcast wave signal output, and amplifies the generated signal to supply an intermediate frequency signal output;
   an AM detection section which detects and outputs an AM modulation signal from the intermediate frequency signal output;
   a sound quality compensation section which compensates sound quality of the signal output from the AM detection section;
   a band-pass filter for extracting a carrier wave frequency component from the intermediate frequency signal output; and
   an integrator for integrating an output from the band-pass filter and outputting a direct current voltage denoting intensity of the carrier wave of the intermediate frequency signal; wherein an AGC circuit for controlling intensity of the received broadcast wave signal output is connected to the front end section, and
   the sound quality compensation section performs the sound quality compensation in accordance with a signal strength meter signal output by the AGC circuit, and, when intensity of the signal strength meter signal is lower than a predetermined level, the sound quality compensation section performs the sound quality compensation in accordance with the direct current voltage output from the integrator.

3. An AM receiver circuit which performs sound quality compensation of an AM detection output signal, comprising:
   a front end section which amplifies a received broadcast wave signal input from an antenna, and outputs a received broadcast wave signal output;
   an intermediate frequency signal section which generates an intermediate frequency signal from the received broadcast wave signal output, and amplifies the generated signal to supply an intermediate frequency signal output;
   an AM detection section which detects and outputs an AM modulation signal from the intermediate frequency signal output;
   a sound quality compensation section which compensates sound quality of the signal output from the AM detection section;
   a band-pass filter for extracting a carrier wave frequency component from the intermediate frequency signal output; and
   an integrator for integrating an output from the band-pass filter and outputting a direct current voltage denoting intensity of the carrier wave of the intermediate frequency signal; wherein
   an AGC circuit for controlling intensity of the received broadcast wave signal output is connected to the intermediate frequency signal section, and the sound quality compensation section performs the sound quality compensation in accordance with a signal strength meter signal output by the AGC circuit, and, when intensity of the signal strength meter signal is lower than a predetermined level, the sound quality compensation section performs the sound quality compensation in accordance with the direct current voltage output from the integrator.

* * * * *